United States Patent

Orcutt et al.

[19]

[11] Patent Number: 4,465,898
[45] Date of Patent: Aug. 14, 1984

[54] CARRIER FOR INTEGRATED CIRCUIT

[75] Inventors: John W. Orcutt, Garland; Richard M. Hardin, Dallas, both of Tex.

[73] Assignee: Texas Instruments Incorporated, Dallas, Tex.

[21] Appl. No.: 286,910

[22] Filed: Jul. 27, 1981

[51] Int. Cl.³ ............................................. H05K 5/00
[52] U.S. Cl. ........................... 174/52 FP; 339/17 CF; 361/412
[58] Field of Search ........................ 339/17 CF, 174; 361/396, 412, 413; 174/52 FP

[56] References Cited

U.S. PATENT DOCUMENTS 3,267,335  8/1966  Walkow .................. 339/17 CF
3,345,541 10/1967  Cobaugh .................. 339/17 CF
4,195,193  3/1980  Grabbe et al. .................. 174/52 FP

*Primary Examiner*—Eugene F. Desmond
*Assistant Examiner*—David L. Pirlot

*Attorney, Agent, or Firm*—Thomas W. Demond; N. Rhys Merrett; Melvin Sharp

[57] ABSTRACT

A carrier having a plurality of leads extending from the lateral sides thereof. The leads extend along the lateral side and over protuberances into depressions in the bottom of the carrier. Each of the depressions is separated by ribs from the other depressions. The ends of the leads disposed in the depressions are prevented from substantial movement by the rib to prevent contact with adjacent leads. At least some of the leads are provided with holes disposed adjacent to the exit of the leads from the enclosure of the carrier. The holes in the leads allow the leads greater flexibility at their portions close to the entrance of the leads into the enclosure. The leads are tapered along their length toward the protuberances. Further, the leads are separated by a width along the lateral side which is within the range of substantially the width of the leads to less than the width of the leads to prevent nesting.

2 Claims, 6 Drawing Figures

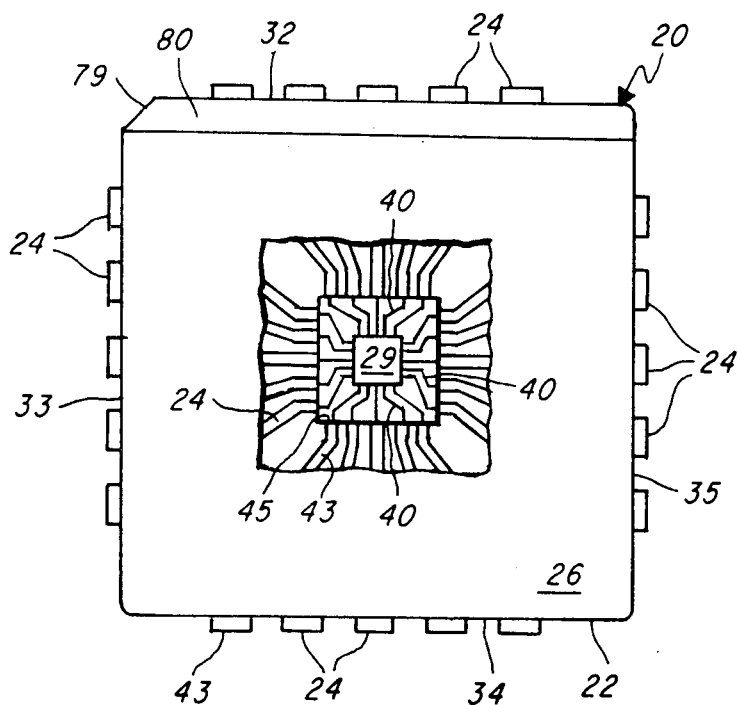
Fig. 1
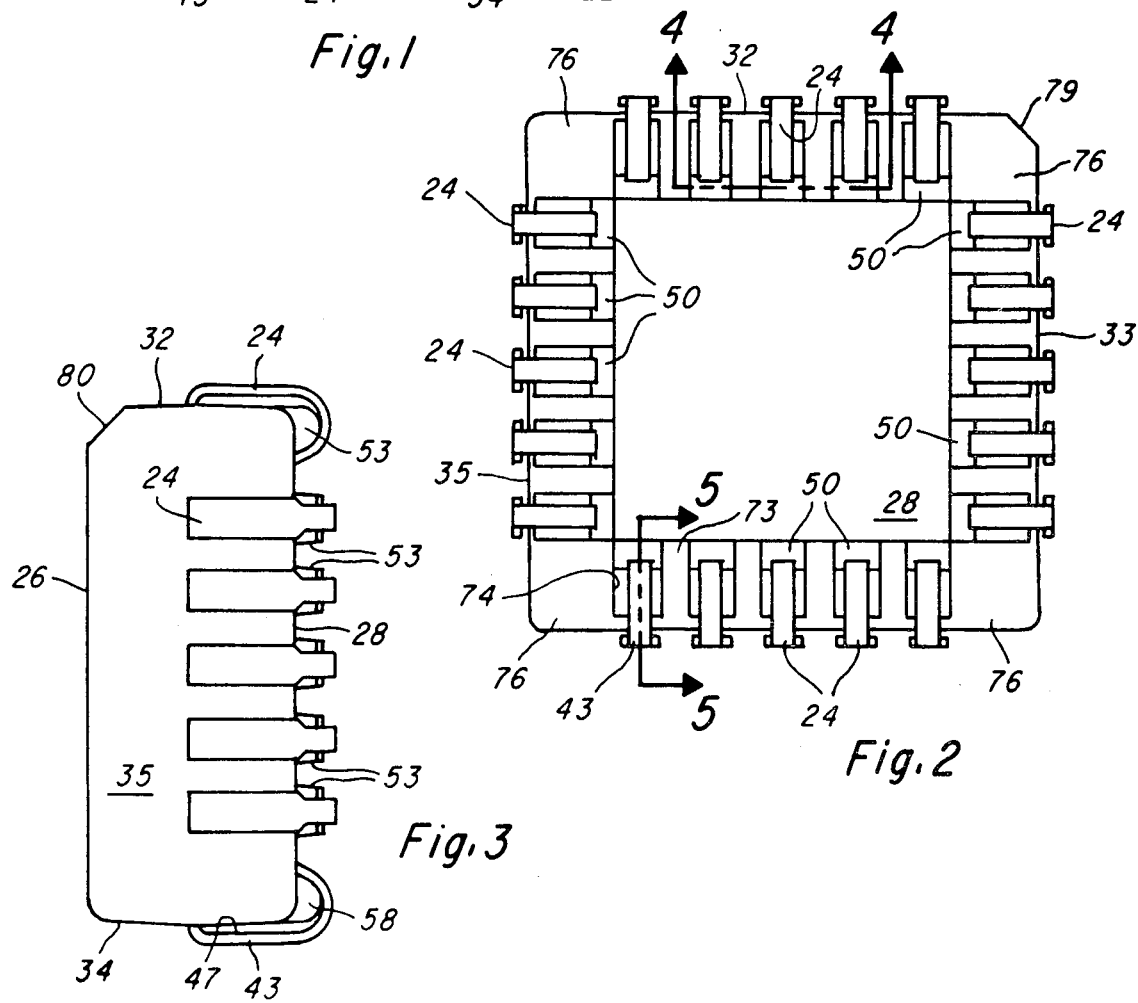
Fig. 2
Fig. 3

CARRIER FOR INTEGRATED CIRCUIT

BACKGROUND OF THE INVENTION

1. Field of the Invention

This invention relates to a carrier for integrated circuits. More particularly, this invention relates to a carrier for integrated circuits which provides for a lead width which is within the range of slightly less than to greater than the width of the space separating the leads to prevent the leads nesting with the leads of other similar carriers.

2. Description of the Prior Art

An appreciable factor in the cost of fabrication of semiconductor packages and particularly those packages embodying integrated circuits is involved with the package or carrier. The common dual in-line package (hereinafter referred to as DIP) has a basic rectangular shape. The leads extend outward from the longer sides of the rectangular shape and then at right angles to below the bottom of the DIP package. As the integrated circuit has increased in functionality and with the move toward smaller geometries increases it is desirable that more and more connections be available to and from the integrated circuit. This has resulted in an increased number of leads. The DIP packages became longer providing more space along the longer sides of the rectangular shape for the increased number of leads.

The ends of the leads extending from the DIP package are not constrained and therefore as subject to being moved laterally into contact with other leads or away from the package. This can lead to breakage of the lead or increased installation costs because the lead must be straightened prior to its installation in, for example, a printed circuit board.

None of the prior constructions shows a carrier which has leads which are of sufficient width with a proper spacing to prevent nesting of the leads with the leads of a similar carrier.

SUMMARY OF THE INVENTION

The present invention involves a carrier for semiconductor devices, for example, integrated circuits. The carrier includes an enclosure which is capable of containing and sealing an integrated circuit therein. The carrier has a plurality of leads which extend from adjacent the integrated circuit outward and through the lateral sides of the carrier. Each lead is connected through a typical bonding technique to one input/output pad of the integrated circuit. In other words, the leads connect the integrated circuit within the enclosure to the outside world. The leads connect the integrated ciruict to its power supply and provide the necessary input/output connections for allowing the integrated circuit to function.

The enclosure of the carrier has a top and bottom and four lateral sides. However, it should be noted that although a square space as shown herein any convenient shape can be utilized, for example, a circular or rectangular shape. The top and bottom of the enclosure are approximately parallel and coextensive. The sides comprise two pairs of opposite, parallel lateral sides. The lateral sides extend from the top to the bottom and at each end to a lateral side of the other pair. Various corners, etc., for example, a rounded corner or a beveled corner, can be provided between adjacent lateral sides.

Each of the leads connected to the integrated circuit extends from its end adjacent to the integrated circuit through a lateral side of the enclosure. The lead then extends along and approximately parallel to the lateral side toward the bottom. For each lead, a protuberance which is parallel and coplanar with the lateral side is provided. The lead extends around the protuberance and into a depression in the bottom of the enclosure. The depression in the bottom of the enclosure which receives the end of the lead prevents that end from contact with other objects and substantially constrains the lead from lateral movement and contact with its adjacent leads. The protuberance has a first slope in coplanarity with its associated lateral side. The protuberance has a rounded end from the first slope to a second slope, which has an angle of approximately 25° with respect to the lateral wall and extends from the rounded end of the protuberance into the depression in the bottom of the enclosure.

The protuberances can be arranged to form a continuous projection along the lateral wall extending beyond the bottom of the carrier. As shown in here, this projection is notched to provide the protuberances discussed. As utilized herein, the term "protuberance" refers to the particular part of the projection, if a continuous projection is provided, over which each particular lead extends. The end of the lead within the depression extends below the bottom and thus is prevented from contact with any other objects. This allows the lead to be thinner because less rigidity and strength is required. If desired, the protuberances can be eliminated and the lead end placed into the depression without the support provided by the protuberances. Also, the ends of the protuberances can be various shapes such as flat with sharp corners. With the end of the lead outside the enclosure so constrained by the depression in the bottom of the enclosure, increased reliability is obtained because it is less likely that the lead will move laterally. Therefore breakage of the leads due to lateral movement and the risk of the leads contacting one another to produce a short is reduced.

At least some of the leads are provided with holes adjacent the point of exit from the enclosure. The holes allow the lead greater flexibility to reduce the strain on the solder connections to a printed circuit board as the board's dimensions change due to thermal effects. The leads have a width along the lateral side which is slightly less than, equal to, or greater than the distance between leads. This prevents nesting of leads, if two carriers come into contact. Nesting occurs when a lead of one carrier inserts between adjacent leads of another carrier. The leads are tapered adjacent the protuberances to a portion having a reduced width which extends over the protuberances into the depression.

It is an advantage of the present invention to provide a carrier for an integrated circuit having improved shipment capabilities.

It is a further advantage of the present invention to provide a lighter weight carrier which utilizes more of the peripheral surface area for lead placement to reduce the size of the carrier.

It is another advantage of the present invention to provide a carrier having reduced size and lower cost.

It is an advantage of the present invention to provide reduced strain on solder connections by utilizing holes in the lead to increase flexibility.

It is another advantage of the present invention to provide leads which have width approximately equal to or greater than the distance between the leads to prevent nesting.

An additional advantage of the present invention is to provide thinner leads for weight reduction and reduced lateral spacing by constraining the end of the lead outside the enclosure containing the integrated circuit within a depression in the bottom of the chip carrier.

It is also an advantage of the present invention to provide the ends of the leads outside the chip carrier containing the integrated circuit with greater stability by placing the ends of the leads within a depression in the bottom of the chip carrier with each lead being provided with its own individual depression.

It is also an advantage of the present invention to provide protuberances under the leads to reduce solder wicking in this area and prevent solder bridging during reflow of the solder for printed circuit board attachment.

It is also an advantage of the present invention to provide protuberances under the lead to support the lead and limit lead distortion from forces bringing the carrier into contact with other objects during circuit board attachment, socketing, testing, or general handling and to prevent movement of said lead away from the enclosure after deformation of the lead over the protuberance.

It is also an advantage of the present invention to provide protuberances under the leads to prevent solder wicking in this area during printed circuit board attachment by solder dipping techniques.

BRIEF DESCRIPTION OF THE DRAWINGS

FIG. 1 is a top view of the integrated circuit carrier of the present invention with portions broken away to reveal internal details (not to scale);

FIG. 2 is a bottom view of the chip carrier of the present invention;

FIG. 3 is a side view of the chip carrier of FIGS. 1 and 2;

DESCRIPTION OF THE PREFERRED EMBODIMENT

Figure 4:
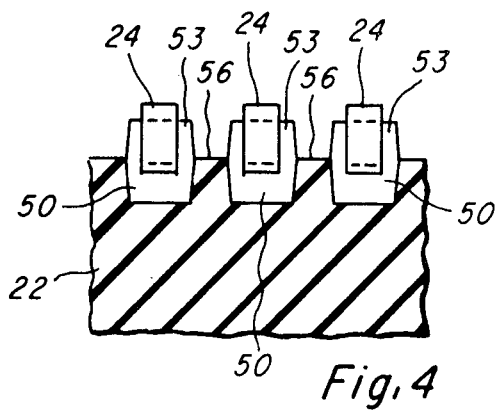
FIG. 4 is a cross-sectional view taken along section line 4—4 of FIG. 2.

The carrier 20, as shown in FIG. 1, has a basically square shape. The carrier 20 includes an enclosure 22 and a plurality of leads 24. The leads can be constructed of an electrically conductive metallic material, for example, copper alloy. The enclosure 22 can be constructed from plastic, for example, epoxy plastic. The chip carrier can be of any convenient shape, however, as shown in FIGS. 1, 2 and 3, it has a generally flat box shape with a top 26, a bottom 28, and four lateral sides 32 through 35 with top 26 and bottom 28 square and lateral sides 32 through 35 rectangular shape. A portion of the top 26 in FIG. 1 has been broken away to reveal an integrated circuit 29 attached to the leads 24 by a plurality of fine bonding wires 40.

Figure 5:
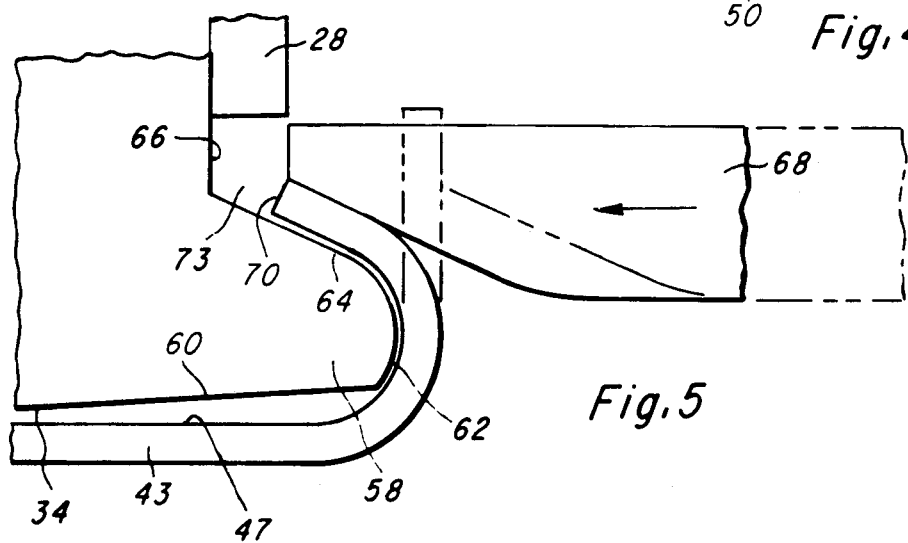
FIG. 5 is a cross-sectional view, on a slightly enlarged scale, taken along section line 5—5 of FIG. 2.

All of the leads 24 are similar and a discussion of a particular lead 43 shall suffice for all. One end 45 of lead 43 is located adjacent to integrated circuit 29 and is connected thereto by one of the bonding wires 40. Lead 43 extends through lateral side 34 (as shown in FIG. 3) at approximately half of the distance between the top 26 and the bottom 28 of the enclosure 22. The lead 43 has flat side 47 (FIGS. 3 and 5).

The corners connecting the lateral sides 32 through 35 can be any convenient shape such as rounded, sharp, or beveled. Lateral sides 32 and 34 form a pair of lateral sides which are parallel and have approximately the same dimensions. Lateral sides 33 and 35 form a pair of lateral sides which are parallel and also have approximately the same dimensions.

Lead 43 extends from its end 45 within the enclosure 22 out lateral side 34 (as shown in FIG. 3) and extends along lateral side 34 toward bottom 28 with flat side 47 thereagainst. All the leads 24 exit the enclosure at approximately the midpoint between the top 26 and the bottom 28 with flat side 47 thereagainst. The bottom 28 (as shown in FIG. 2) is provided with a plurality of depressions 50. Each depression is separated from the other depressions by a portion of the bottom 28 which is at the same level as the remainder of the bottom. Specifically as shown herein, the separating portion is slightly above the remainder of the bottom, although it can be lower than the remainder. Also, the protuberance can have the same level as the bottom if deeper depressions are provided. The leads 24 extend to an end located in the depressions 50 as shown in FIG. 2.

In FIG. 3, the leads 24 are shown extending along the lateral sides over a plurality of protuberances 53. The protuberances 53 can be arranged along each lateral side to form a single projection which extends beyond the bottom 28. The protuberances have one slope side which is coplanar with the lateral side from which it extends. Each lead extends over its associated protuberance into one of the depressions 50. One of the depressions 50 is associated with each of the protuberances which in turn is associated with one of the leads. If the protuberances are formed into a single projection, then it is only necessary that one of the depressions is associated with each of the leads.

As shown in FIG. 4, each of the leads 24 extends over a projection 53 into a depression 50. Each depression is separated by a portion of the bottom which is at approximately the same level as the bottom (but slightly above) which forms ribs 56. The ends of the leads 24 are thus substantially constrained from movement parallel to the plane of the lateral side, through which it extends, by the ribs 56. The rib 56 thus supports leads 24 and prevents adjacent leads of leads 24 from coming into contact. Since the ribs provide support against lateral movement, the leads can be constructed of a thinner material.

Lead 43, as shown in FIG. 5, extends over its associated protuberance 58 with flat side 47 thereagainst. Protuberance 58 is similar to the other protuberances 53 and a detailed discussion of one protuberance shall suffice for all. A slope 60 of protuberance 58 has coplanarity with the lateral side 34. The lateral side 34 may have a small slope from its midpoint to its connection with bottom 28 of, for example,.approximately 30. The protuberance extends from slope 60 through a rounded end 62. A slope 64 of protuberance 58 extends from rounded end 62 into a depression 66 which is one of the depressions 50. The slope 64 has an angle of approximately 250 with respect to the lateral side 34. The slope 64 extends toward bottom 28 and away from lateral side 34 and generally toward lateral side 32 (FIG. 2).

Lead 43 is shown in FIG. 5 in two positions. First, lead 43 (as shown by the broken line) is bent over rounded end 62, then a punch 68 (shown by the broken line) contacts the portion of the lead extending beyond rounded end 62. The punch 68 (shown at its second position by a solid line) forces the lead to deform and move angularly to a position adjacent to slope 64 (shown by a solid line). The end 70 of lead 43 is now disposed within depression 66. The end 70 is prevented from lateral movement by ribs 73 and 74 (FIG. 2) of ribs 56. The corners 76 of bottom 28 are also raised to provide the ribs, for example, rib 74 in FIG. 2.

In FIG. 5, the punch moves from its first position at the right (as shown in FIG. 5) toward the second position (as shown in FIG. 5). This causes lead 43 to bend around and over rounded end 62 and into contact with or close proximity to slope 64. The lead 43 deforms and, even after punch 68 is removed from contact with lead 43, the end 70 remains closely adjacent to slope 64 with flat side 47 thereagainst.

If force is applied to pull lead 43 away from slope 60 and lateral side 34 of enclosure 22, the end 70 and the portion of lead 43 adjacent thereto contacts slope 64 to prevent such movement. After deformation by punch 68, flat side 47 does not move away from slope 60 as a result of a spring-back action after deformation since end 70 contacts slope 64. End 70 is protected from contact with other objects by being disposed within depression 66. The ends of the other leads 24 are also protected within their respective depression 50.

The enclosure 22 has beveled edges 79 and 80 (FIG. 1) which are useful in aligning the carrier for proper connection of the leads to, for example, a printed circuit board.

Figure 6:
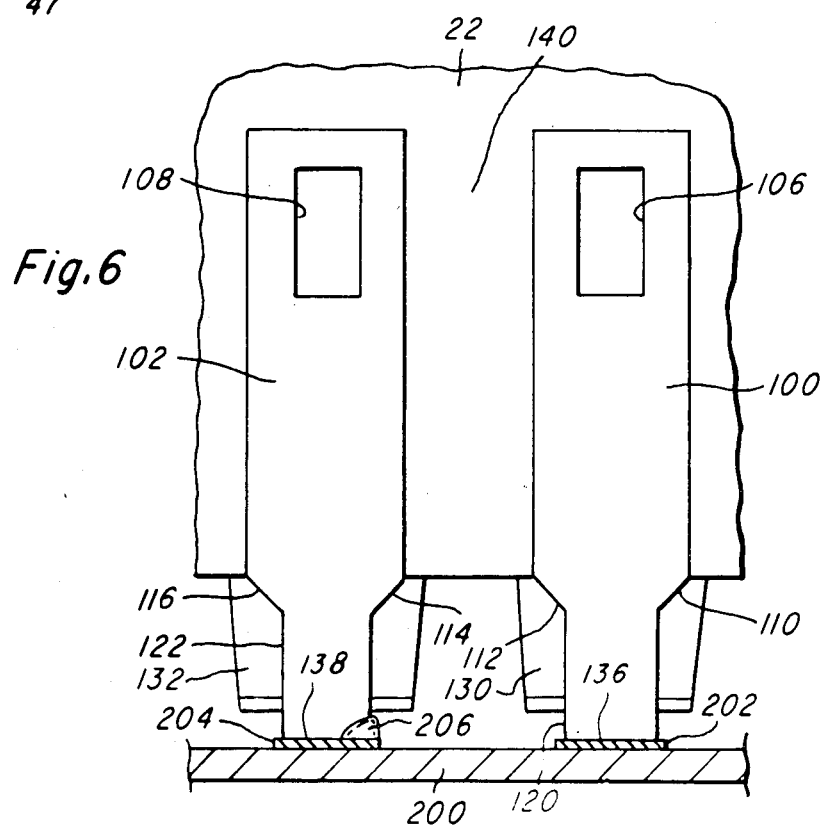
FIG. 6 is a partial view of a carrier showing a side view of two adjacent leads.

As shown in FIG. 6, adjacent leads 100 and 102, which are two of leads 24, extend from enclosure 22. Leads 100 and 102 have openings or holes 106 and 108, respectively, located therein close to the exit of the leads out of enclosure 22. The holes as shown are rectangular; however, any convenient shape can be utilized. The holes provide increased flexibility to the leads. The leads 100 and 102 extend to downward (as shown in FIG. 5) to thinner portions 120 and 122, respectively. The lead 100 has tapered edges 100 and 112 to thinner portions 114 and 116. The thinner portions 120 and 122 extend over protuberances 130 and 132 into two of the depressions 50 (not shown in FIG. 6). The leads 100 and 102 can be attached by soldering to a printed circuit board 200 at the lower portion 136 and 138, respectively, over their respective protuberances.

When leads 100 and 102 are soldered to contact pads 202 and 204, respectively, of printed circuit board 200, lower portions 136 and 138 are in contact with contact pads 202 and 204. The solder 206 is attached to thinner portions 120 and 122 (only a portion of the solder is shown attached to lead 102). The solder can be applied to the leads on either or both sides of the thinner portions 120 and 122 from the contact at lower portions 136 and 138, respectively, with the printed circuit board 200. Soldering can be by reflow, dipping, wave, or other appropriate techniques.

The protuberances 130 and 132 provide support to the leads 100 and 102, respectively, when the contact is made with the printed circuit board or any other object, for example, another carrier during shipment or during insertion into a socket. The socket can provide for contact with the leads between the tapers and the entrance of the leads into the enclosure along the lateral sides of the enclosure 22. The protuberances 130 and 132 also limit the amount of solder which can accumulate between the leads 100 and 102, and enclosure 22 as a result of a wicking action to prevent the solder 206 from bridging between the adjacent leads 100 and 102.

The holes 106 and 108 allow the leads 100 and 102 to flex for compensating for changes in the dimensions of the printed circuit board due to thermal effects. The leads 100 and 102 are separated by an area 140. The distance across the area 140 between leads 100 and 102 is approximately equal to the width of lead 100. The lead 102 has a width approximately equal to lead 100. The width of the leads can exceed the space separating, i.e., area 140 or be slightly less than if the leads are not perfectly parallel. Thus, the width of area 140 can be slight greater than, equal to, or less than the width of lead 100. These relative widths provide a spacing between leads which prevents a lead of another carrier (not shown) similar to carrier 20 from fitting or nesting between leads 100 and 102. The nesting can cause damage to the leads especially in automatic processing operations.

Whereas the present invention has been described in particular relation with the drawings attached hereto, it should be understood that other and further modifications, apart from those shown or suggested herein, may be made within the scope of this invention.

What is claimed is:

1. A carrier for an integrated circuit comprising:
  (a) an enclosure having said integrated circuit disposed therein and a top, bottom, and four flat lateral sides, and provided with a plurality of protuberances along each lateral side;
  (b) a plurality of leads, at least one lead extending from an end thereof located in said enclosure through each lateral side and along said lateral side toward said bottom, each lead extending over one of said protuberances and spaced from an adjacent lead by a distance within the range of substantially equal to the width of said lead to less than the width of said lead.

2. Carriers for integrated circuits, each carrier comprising:
  (a) an enclosure having said integrated circuit disposed therein and a top, bottom, and four flat lateral sides, and provided with a plurality of protuberances along each lateral side; and
  (b) a plurality of leads, at least one lead extending from each of said lateral sides toward said bottom, at least two adjacent leads extending approximately parallel from within said enclosure along one lateral side toward said bottom, each adjacent lead extending over one of said protuberances, said adjacent leads having approximately equal widths, one adjacent lead spaced from another adjacent lead by a distance within the range of from substantially equal to the width of said one adjacent lead to less than the width of said one adjacent lead to prevent nesting of a lead of another carrier between said one and another adjacent leads.

* * * * *